United States Patent [19]

Kinugawa

[11] Patent Number: 4,971,926

[45] Date of Patent: Nov. 20, 1990

[54] METHOD OF MANUFACTURING A SEMICONDUCTOR DEVICE

[75] Inventor: Masaaki Kinugawa, Tokyo, Japan

[73] Assignee: Kabushiki Kaisha Toshiba, Kawasaki, Japan

[21] Appl. No.: 285,395

[22] Filed: Dec. 16, 1988

Related U.S. Application Data

[60] Continuation of Ser. No. 939,248, Dec. 8, 1986, abandoned, which is a division of Ser. No. 765,193, Aug. 13, 1985, abandoned.

[30] Foreign Application Priority Data

Aug. 28, 1984 [JP] Japan .................. 59-178646

[51] Int. Cl.⁵ .......................................... H01L 21/76
[52] U.S. Cl. ...................................... 437/67; 437/60; 437/63; 437/64; 437/203; 437/918; 437/919
[58] Field of Search ..................... 437/70, 71, 72, 67, 437/63, 64, 918, 919, 60, 203; 357/23.6, 51, 55, 60

[56] References Cited

U.S. PATENT DOCUMENTS

| | | | |
|---|---|---|---|
| 3,785,886 | 1/1974 | Castrucci et al. | 357/60 |
| 3,965,453 | 6/1976 | Seidel et al. | 338/13 |
| 3,998,674 | 12/1976 | Cameron et al. | 437/70 |
| 4,131,496 | 12/1978 | Weitzel et al. | 357/60 |
| 4,278,987 | 7/1981 | Imaizumi et al. | 357/48 |
| 4,327,476 | 5/1982 | Iwai et al. | 437/59 |
| 4,362,599 | 12/1982 | Imaizumi et al. | 156/647 |
| 4,509,249 | 4/1985 | Goto et al. | 437/67 |
| 4,577,208 | 3/1986 | Schutten et al. | 357/23.4 |

FOREIGN PATENT DOCUMENTS

| | | |
|---|---|---|
| 85988 | 8/1983 | European Pat. Off. . |
| 2949360 | 6/1980 | Fed. Rep. of Germany . |
| 2551265 | 3/1985 | France . |
| 0059753 | 5/1980 | Japan .................. 357/60 |
| 0049633 | 3/1985 | Japan . |
| 0261178 | 11/1987 | Japan . |
| 0009964 | 1/1988 | Japan . |
| 0080561 | 4/1988 | Japan . |
| 0080562 | 4/1988 | Japan . |
| 0148675 | 6/1988 | Japan . |
| 0197365 | 8/1988 | Japan . |
| 2145375 | 8/1983 | United Kingdom . |

OTHER PUBLICATIONS

Ueda et al., "A New Vertical Power MOSFET Structure With Extremely Reduced On-Resistance", IEEE Trans. on Electron Devices, vol. ED-32, No. 1, Jan. 1985, pp. 2–6.

Cullity, *Elements of X-Ray Diffraction,* 2nd edition, Addison-Wesley Publishing Co., Inc., 1978.

Kendall, "On Etching Very Narrow Grooves in Silicon", Appl. Phys. Letts., vol. 26, No. 4, Feb. 15, 1975, pp. 195–198.

Kittel, C., *Introduction to Solid State Physics,* 4th edition, John Wiley and Sons, Inc., 1971, pp. 22–23.

Grove, A. S., *Physics and Technology of Semiconductor Devices,* John Wiley and Sons, Inc., 1967, p. 342.

Sunami et al., "A Corrugated Capacitor Cell (CCC)," IEEE Transactions on Electron Devices, vol. ED-31, No. 6, Jun. 1984.

Huo et al., "A Novel Etch Mask Process for the Etching of (011) Oriented Facet V-Grooves in InP (100) Wafers", J. Electrochem. Soc., vol. 134, No. 11, Nov. 1987, pp. 2850–2856.

Kendall, "Vertical Etching of Silicon at Very High Aspect Ratios", Ann. Rev. Mater. Sci., 1979.9, pp. 373–403.

*Primary Examiner*—Olik Chaudhuri
*Assistant Examiner*—M. Wilczewski
*Attorney, Agent, or Firm*—Finnegan, Henderson, Farabow, Garrett, and Dunner

[57] ABSTRACT

A semiconductor device comprising a semiconductor substrate having a principal surface constituted by crystal plane (100) formed with a groove, which is utilized for an element isolation region, a capacitor element, etc., wherein at least one of the side wall surfaces of the groove is constituted by a (100) crystal plane. There is also proposed a method of forming a groove having at least one crystal plane side surface in a crystal plane surface of a semiconductor substrate.

2 Claims, 3 Drawing Sheets

F I G. 4
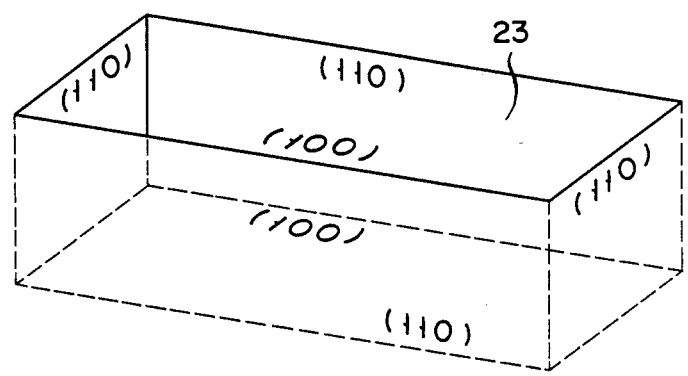
F I G. 5
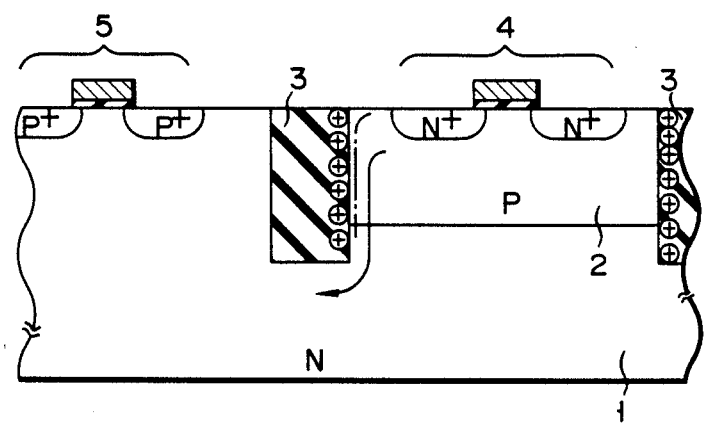
F I G. 6
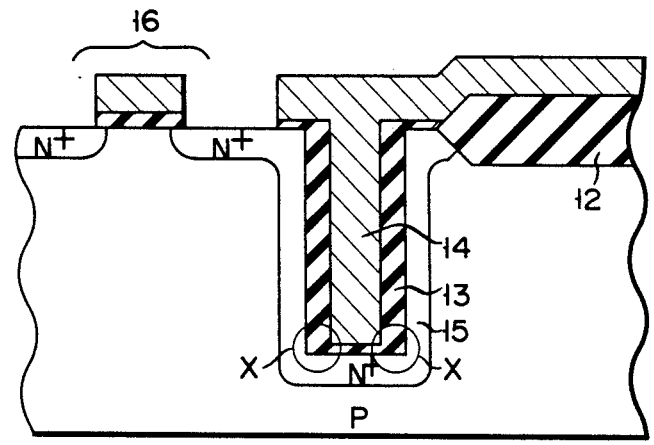

METHOD OF MANUFACTURING A SEMICONDUCTOR DEVICE

This application is a continuation of application Ser. No. 06/939,248, filed Dec. 8, 1986, now abandoned, which was a division of application Ser. No. 06/765,193, filed Aug. 13, 1985, now abandoned.

BACKGROUND OF THE INVENTION (a) Field of the Invention

This invention relates to improvements in a semiconductor device, particularly a semiconductor device, in which a groove formed in a semiconductor substrate and having side wall surfaces perpendicular to the principal surface of the substrate is utilized for an element isolation region, a capacitor element, etc., and also a method of manufacturing the same.

(b) Description of the Prior Art

In order to enhance the integration density of the semiconductor integrated circuit device, it has been in practice to form a semiconductor substrate with a groove having groove walls perpendicular to the principal surface of the substrate, cover the groove surface with an insulating film and use this region for element separation or capacitance element or the like. The groove having walls perpendicular to the principal surface of the substrate as noted above, is formed by anisotropic etching, e.g., RIE (reactive ion etching).

FIG. 1 shows an example of application of this method to the separation of a well region in a CMOS from a substrate region. Referring to the Figure, reference numeral 1 designates an n-type silicon substrate, in which a p-type well region (p-type well) 2 is formed. A groove surrounding the p-type well 2 is formed, and a silicon oxide film 3 is formed in the groove. An n-channel MOS transistor 4 is formed in the p-type well 2, and a p-channel MOS transistor 5 is formed in the n-type substrate region. By isolating the p-type well 2 and n-type substrate region 1 from each other with the insulating layer 3, it is possible to suppress operation of a lateral parasitic bipolar transistor that is present between the p-type well 2 and n-type substrate region 1, thus preventing the phenomenon of latch-up. It is thus possible to reduce the distance between the p-type channel MOS transistor 4 and n-type channel MOS transistor 5 to improve the integration density.

FIG. 2 shows an example of application of the groove formation method noted above to a DRAM memory cell capacitor element. Referring to the Figure, reference numeral 11 designates a p-type silicon substrate. A field oxide film 12 is formed by a selective oxidation process on the surface of the silicon substrate 11, which isolates a surrounded memory cell region. A groove having a rectangular sectional profile is formed by the RIE process in the memory cell region, and an electrode 14 consisting of a polycrystalline silicon layer is formed over the groove surface via a thermal oxide film 13. An n-type impurity region 15 is formed by doping the silicon substrate 11 with an n-type impurity from the wall surface of the groove. A DRAM capacitor element is constituted by the n-type impurity region 15, thermal oxide film 13 and polycrystalline silicon electrode 14. Reference numeral 16 designates a transfer transistor of the DRAM memory cell, with the drain region of the transfer transistor being contiguous to the n-type impurity region 15 of the capacitor element. By forming the capacitor element by making use of the groove wall surface of the groove, it is possible to reduce the element area exclusively occupied by the capacitor element and hence increase the integration density.

The method of improving the integration density by making use of a groove having walls perpendicular to the principal surface of the substrate as described above, also finds extensive applications to resistor elements and ordinary element isolation.

As shown in FIG. 3, a silicon substrate 21 which is used for the manufacture of a semiconductor device is wafer-like (hereinafter referred to as silicon wafer), the principal surface of which is constituted by crystal plane (100) of plane orientation. The silicon wafer has an orientation flat 22 of crystal plane (110) perpendicular to the principal surface. When manufacturing a semiconductor device shown in FIGS. 1 and 2, the groove 23 used for a capacitor element or isolation region, is formed to extend in a direction parallel to or perpendicular to the orientation flat 22. This is done so because the circuit patterns concerned are formed by computer processing, and it is rather difficult to deal with lines which are neither parallel or perpendicular to the orientation flat as computer data.

With the groove 23 formed to extend in a direction parallel or perpendicular to the orientation flat 22, all the groove wall surfaces perpendicular to the principal surface of the silicon wafer 21 are constituted by crystal plane (110), while the groove bottom surface which is parallel to the principal surface, is constituted by crystal plane (100).

The fact that the exposed surfaces of the groove used for the formation of a capacitor element or a element isolation region are constituted by crystal plane (100) at the bottom and crystal plane (110) at sides perpendicular to the bottom, poses problems.

A first problem is that in case of a CMOS the possibility of latch-up due to current leak is increased with increasing integration density in spite of the presence of the groove-like insulating isolation region.

A second problem is that in case of a capacitor element of a DRAM memory cell as noted above the breakdown voltage of the portion where the groove is formed is deteriorated with increase of the integration density.

SUMMARY OF THE INVENTION

The invention has been intended in view of the above situation, and its object is to provide a semiconductor device, in which a groove having side walls perpendicular to the principal surface of a silicon substrate is used for a capacitor element or for element isolation or the like to increase the integration density, and which can solve the problems of current leak or deterioration of breakdown voltage due to different crystal planes of the bottom surface and side surfaces of the groove, and a method of manufacturing the same.

According to the invention, there is provided a semiconductor device, which comprises a semiconductor substrate having a principal surface constituted by crystal plane (110) formed with a groove having side wall surfaces perpendicular to the principal surface, an insulating film covering the surfaces of the groove, and a capacitor element or a high resistance resistor element or an element isolation region formed in the region of the groove, wherein at least one of the side wall surfaces of the groove is constituted by crystal plane (100).

According to the invention, there is also provided a method of manufacturing a semiconductor device comprising the steps of forming a semiconductor wafer having a principal surface constituted by crystal plane (100) and an orientation flat constituted by crystal plane (110), forming a groove having side wall surfaces perpendicular to the principal surface, forming an insulating film covering the surfaces of the groove, and forming a capacitor element or a high resistance resistor element or an element isolation region in the region of the groove, wherein the groove-forming step is conducted such that at least one of the side wall surfaces of the groove being constituted by crystal plane (100) extending in a direction at an angle of 45° with respect to the direction of the orientation flat.

BRIEF DESCRIPTION OF THE DRAWINGS

FIG. 4 is a view for explaining the plane orientation of side walls of a groove in a prior art semiconductor device;

FIGS. 5 and 6 are sectional views showing a semiconductor element for explaining problems inherent in the prior art semiconductor element;

DETAILED DESCRIPTION OF THE PREFERRED EMBODIMENT

Figure 1:
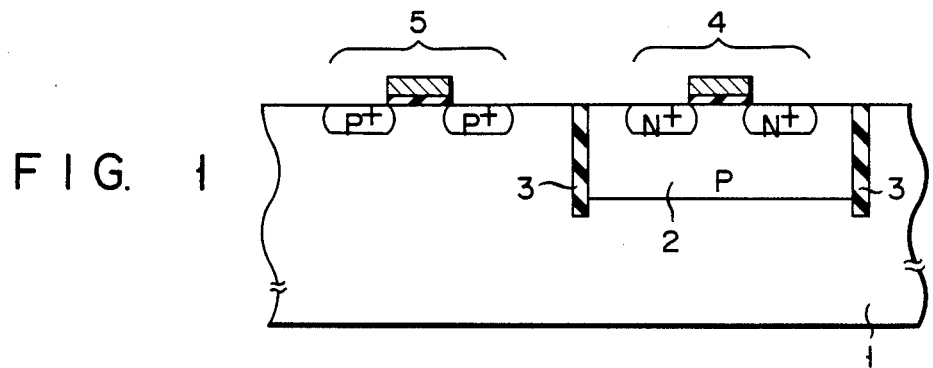
FIG. 1 is a sectional view showing a prior art CMOS with a groove perpendicular to the principal surface of a substrate.

The inventor made investigations concerning the cause of the first problem noted above to find that the problem stems from the fact that more characteristic positive charge is generated at the interface silicon and insulating film (e.g., SiO₂ film) with plane {110} than with plane {100}. This will now be discussed in connection with a CMOS as shown in FIG. 1. As shown in FIG. 5, with generation of a large amount of the positive fixed charge noted above at the interface between the silicon oxide film 3 and p-type well 2, an inversion layer is liable to be formed in the p-type well 2, as shown by a phantom line, due to storage of electrons. Consequently, a leak current flows through the inversion layer as shown by an arrow to cause latch-up.

Similar current leak also occurs in case of an ordinary MOS type semiconductor device using a p-type substrate if element isolation is done using the groove as noted above.

Figure 2:
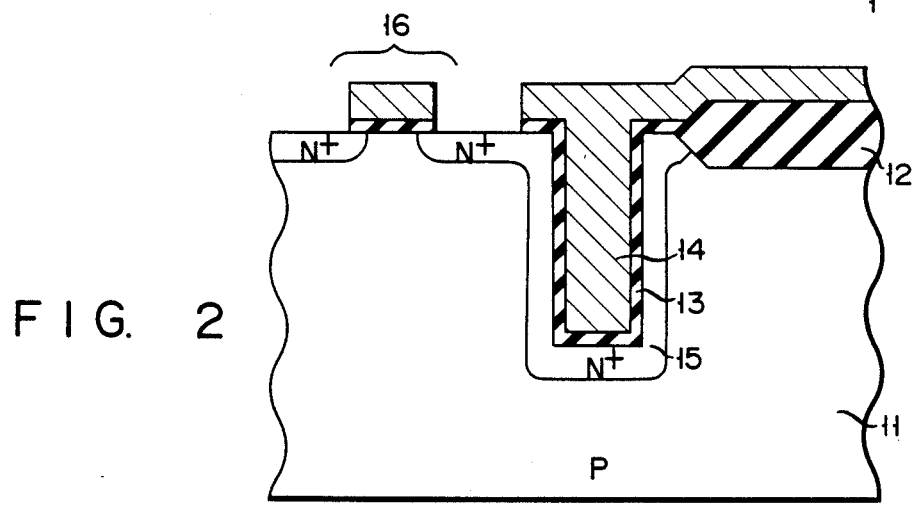
FIG. 2 is a sectional view showing a prior art DRAM capacitor element with a groove perpendicular to the principal surface of a substrate.
Figure 3:
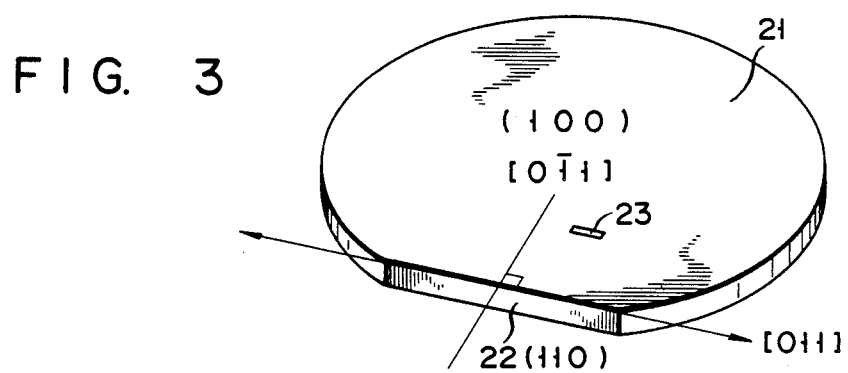
FIG. 3 is a perspective view showing a wafer for explaining the formation of a groove in a prior art semiconductor device.

As a result of investigations conducted in connection with the cause of the second problem, it is found that the problem stems form the fact that the speed of thermal oxidation of the silicon substrate surface is higher with plane {110} than with plane {100}. This will be discussed in connection with a capacitor element shown in FIG. 6, which is the same as the one shown in FIG. 2. With the variation of the oxidation speed with different crystal orientations, the thermal oxide film 13 covering the groove surfaces is thin along the bottom and thick along the side walls of the groove. Due to this lack of the uniformity of film thickness, the breakdown voltage is deteriorated in portions shown by circles X. If the breakdown voltage of the bottom portion is to be increased, the thickness of the film along the side walls has to be excessively increased to reduce the capacitance of the element.

The first and second problems noted above have heretofore been given substantially no consideration. This has been so because these problems have given no substantial influence the integration density has not been so high. In addition, the convenience in the mask preparation has not been a prerequisite.

With the semiconductor device according to the invention, the bottom surface and at least one of the side surfaces of the groove are constituted by crystal plane (100), so that the positive fixed charge generated at the interface with the insulating film formed to cover the surfaces of the groove is reduced compared to the prior art. It is thus possible to suppress the current leak through the inversion layer. Further, the oxidation speed is entirely uniform over the surfaces of the groove, it is possible to obviate the deterioration of the capacitance and breakdown voltage due to lack of uniformity of the thickness of the insulating film even where a capacitance element or high resistance resistor element is formed with the insulating film used as thermal oxide film.

Further, with the method of manufacture according to the invention the intended semiconductor device can be obtained by using the same process and same semiconductor wafer as in the prior art only except for that the direction of the groove is changed. In this case, when preparing a mask for forming the groove pattern, a line at an angle of 45° has to be produced. It is possible to produce a 45° pattern through computer processing although there may be some difficulty in the data processing.

Further, the semiconductor device according to the invention may be obtained not only by the method according to the invention but by the prior art process if a semiconductor wafer to be employed has an orientation flat constituted by crystal plane (100)

(EMBODIMENT OF THE INVENTION)

Now, an embodiment of the semiconductor device according to the invention applied to a capacitor element and a method of manufacturing the same will be described will be described with reference to FIGS. 7, 8 and 9A to 9D.

Figure 7:
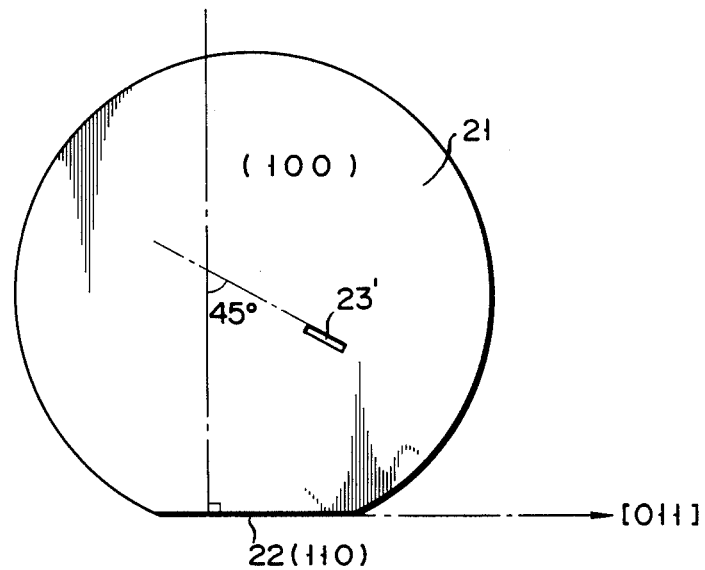
FIG. 7 is a plan view showing a wafer for explaining the formation of a groove in a semiconductor device according to the invention.
Figure 8:
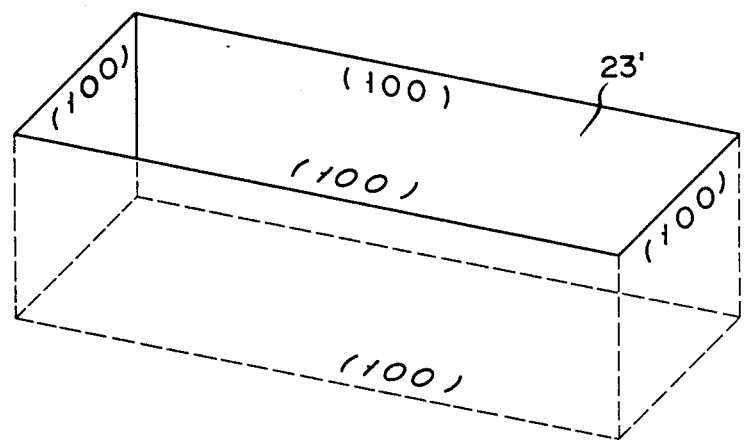
FIG. 8 is a view for explaining the plane orientation of side walls of the groove in the semiconductor device according to the invention.

In the embodiment of the manufacture, a conventional p-type silicon substrate 21 is used, the principal surface of which is constituted by crystal plane (100) and which has an orientation flat 22 constituted by crystal plane (110). A field oxide film is selectively formed on the surface of the p-type silicon substrate 21. Then, a groove 23' is formed through selective RIE using a resist pattern for forming a capacitor element in an element region. At this time, as shown in FIG. 7, the groove 23' is formed such that it has a rectangular plan shape and extends in a direction at an angle of 45° with respect to the orientation flat 22. The side walls of the groove 23', which are perpendicular to the principal surface of the substrate, are all constituted by crystal planes {100}, as shown in FIG. 8. The bottom surface of the groove 23' which is parallel to the main surface of the substrate is naturally constituted by crystal plane (100). Thus, all the groove walls defining the groove 23' are constituted by crystal plane (100). The groove 23' in FIG. 7 is shown only for the purpose of showing the direction and is greatly different in size from the actual size.

Figure 9A:
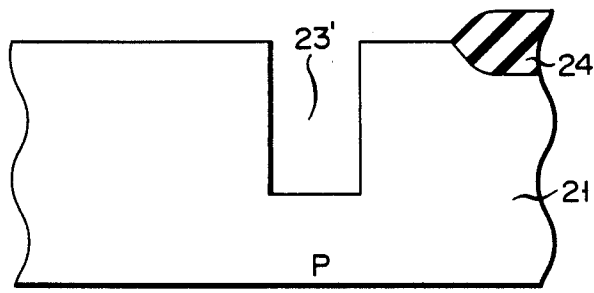
FIGS. 9A to 9D are sectional views showing successive steps of manufacture of a semiconductor device according to the invention.
Figure 9B:
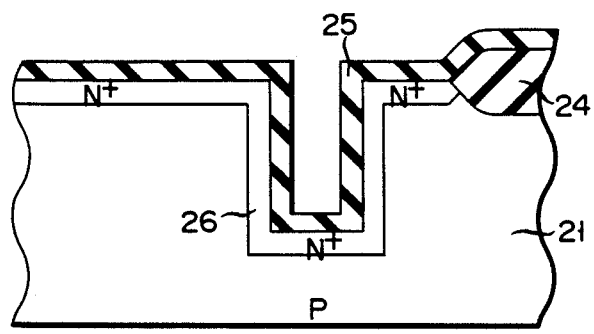

FIG. 9A shows a sectional view showing an element region with a groove 23' formed for a capacitor element.

Then, a PSG film (phosphor-doped silicon oxide film) 25 with a film thickness of approximately 3,000 Å is deposited by a CVD process over the entire area, as shown in FIG. 9. The system is then annealed at 1,000° C. for 10 minutes, whereby phosphorus is thermally diffused from the PSG film 25 into the silicon substrate to form an n+-type impurity diffusion region 26.

Figure 9C:
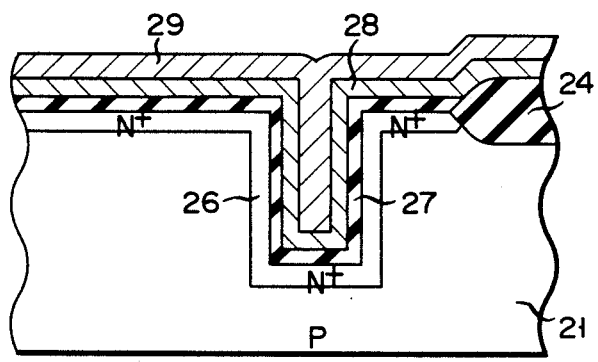

Subsequently, the PSG film 25 is separated, and the surface of the silicon substrate is thermally oxidized to form a thermal oxide film 27 having a thickness of approximately 100 Å. Then, a polycrystalline silicon layer 28 having a thickness of approximately 350° C. is deposited by a CVD process. Then, phosphorus is diffused for 30 minutes, and a polycrystalline silicon layer 29 is deposited again over the entire surface to fill the groove 23', thus obtaining a structure as shown in FIG. 9C.

Figure 9D:
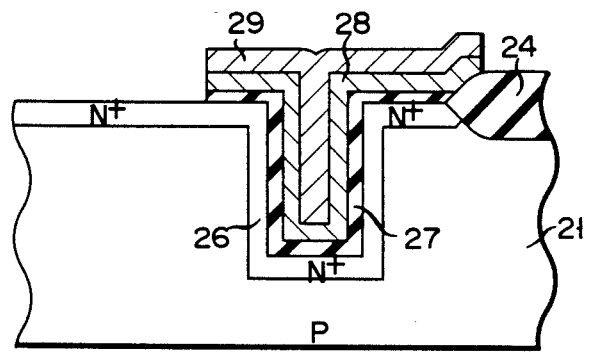

Thereafter, unnecessary portions of the thermal oxide film 27 and polycrystalline silicon layers 28 and 29 are removed, whereby a capacitor element as shown in FIG. 9D is formed, which has n+-type impurity diffusion region 26 and polycrystalline silicon layer 28 as electrodes and the thermal oxide film 27 as dielectric.

In the above capacitor element as an embodiment of the invention, the surfaces of the groove 23' are all in the crystal planes {100}, so that the thermal oxide film 27 has a uniform thickness. It is thus possible to solve the problem of deterioration of the breakdown voltage due to lack of uniformity of the oxide film and obtain excellent characteristics.

While the above embodiment of the invention has been a capacitor element, it will be understood that when the invention is applied to the isolation of a well in a CMOS or isolation of an element, it is possible to obtain an effect of suppressing leak current due to fixed charge generated at the interface with the insulating film.

Further, while the above embodiment the bottom surface of the groove has been parallel to the principal surface of the semiconductor wafer, this is by no means limitative, and the groove may have a bottom of V-shaped profile.

As has been described in the foregoing, according to the invention a groove having side walls perpendicular to the principal surface of a silicon substrate is used for a capacitor element or for element isolation or the like to increase the integration density. Also, it is possible to solve the problems of current leak or deterioration of breakdown voltage due to different crystal planes of the bottom surface and side surfaces of the groove.

What is claimed is:

1. A method of manufacturing a semiconductor device, comprising the steps of forming a silicon semiconductor wafer having a principle surface constituted by crystal plane (100) and an orientation flat constituted by crystal plane (110); forming a groove having side wall surfaces perpendicular to said principal surface; forming a silicon oxide insulating film covering the surfaces of said groove; and forming a capacitor element or a high resistance resistor element or an element isolation region in the region of said groove; wherein the groove-forming step is conducted such that at least one of the side wall surfaces of said groove is constituted by crystal plane (100) extending in a direction at an angle of 45° with respect to the direction of said orientation flat (110) to minimize current leak and deterioration of breakdown voltage.

2. The method of manufacturing a semiconductor device according to claim 1, wherein all the side wall surfaces of said groove are constituted by crystal plane (100) extending in a direction at an angle of 45° with respect to the direction of said orientation flat (110).

* * * * *